United States Patent [19]

Ruemenapf et al.

[11] Patent Number: 4,947,122

[45] Date of Patent: Aug. 7, 1990

[54] METHOD AND APPARATUS FOR ADJUSTING A BIMETAL TRIP ELEMENT

[75] Inventors: Horst Ruemenapf; Gerhard Rathenow, both of Berlin, Fed. Rep. of Germany

[73] Assignee: Siemens Aktiengesellschaft, Berlin & Munich, Fed. Rep. of Germany

[21] Appl. No.: 326,913

[22] Filed: Mar. 22, 1989

[30] Foreign Application Priority Data

Mar. 22, 1988 [DE] Fed. Rep. of Germany ....... 3810043

[51] Int. Cl.[5] .............................................. G01R 31/32

[52] U.S. Cl. ...................................... 324/417; 324/424

[58] Field of Search ............... 324/415, 417, 424, 423; 337/360, 368; 340/594

[56] References Cited

U.S. PATENT DOCUMENTS

| | | | |
|---|---|---|---|
| 3,162,739 | 12/1964 | Klein et al. | 200/88 |
| 3,244,837 | 4/1966 | Strobel | 200/116 |
| 3,259,839 | 7/1966 | Coleman et al. | 324/424 |
| 3,757,207 | 9/1973 | Hire | 324/417 |
| 3,815,064 | 6/1974 | Maier et al. | 335/176 |
| 3,947,758 | 3/1976 | Sutton | 324/417 |

FOREIGN PATENT DOCUMENTS

| | | | |
|---|---|---|---|
| 0248702 | 12/1987 | European Pat. Off. . | |
| 1199869 | 9/1965 | Fed. Rep. of Germany . | |
| 2532321 | 1/1977 | Fed. Rep. of Germany . | |
| 2165970 | 8/1973 | France . | |
| 0657412 | 4/1979 | U.S.S.R. | 324/417 |

*Primary Examiner*—Reinhard J. Eisenzopf
*Assistant Examiner*—Jack B. Harvey
*Attorney, Agent, or Firm*—Kenyon & Kenyon

[57] ABSTRACT

A method and apparatus for adjusting a bimetal trip element. The object is to provide a method to adjust bimetal trip elements for electric switching devices, which produces a reliable result in a standard number of adjustment steps. Based on the measurement of the path that a tripping shaft travels until the latching is released and of the force required for this, a processor computes a value, which is used to set-up an adjusting screw. Subsequentially, when the bimetal strip is heated as a function of current, the time it takes the bimetal strip to travel until contact is made with the adjusting screws and also the total tripping time are determined. From these values, the processor computes a correction value to control a screwdriver which adjusts the adjusting screw. An auxiliary device contains a contact slide to incorporate the adjusting screws and the bimetal strips in a signal circuit, as well as a driving arrangement to move the contact slide. The adjustment procedure is suited for the bimetal trip elements in low-voltage circuit-breakers, especially in tripping units, which are designed for applications in compact switching devices with housings made of insulating material.

5 Claims, 1 Drawing Sheet

METHOD AND APPARATUS FOR ADJUSTING A BIMETAL TRIP ELEMENT

BACKGROUND OF THE INVENTION

The present invention relates to a method of adjusting a bimetal trip element in an electric switching device with at least one bimetal strip securely fixed on one side, one tripping shaft to be pressurized by the unlatched end of the bimetal strip, as well as an adjusting screw.

Switching devices of this type are used particularly in low voltage applications and are well known in diverse designs. In addition to three-pole trip elements, such as those found in U.S. Pat. Nos. 3,162,739, 3,244,837 or 3,815,064, there are also monopole configurations for power circuit-breakers or similar small circuit-breakers. To adjust the bimetal trip element, it is customary to first set up the adjusting screw and then to perform a tripping test. This requires that the switching device, or at least the part of the switching device that contains the bimetal trip element, be connected to a test circuit. Depending on the result of the tripping test, the setting of the adjusting screw must then be corrected and another test is performed, after the bimetal strips have first cooled down to ambient temperature. Several tests might be necessary, depending on the desired or required accuracy of the adjustment. The time needed for such an adjustment is, therefore, considerable.

SUMMARY OF THE INVENTION

It is an the object of the present invention to provide a method of adjusting a bimetal trip element, which not only can be performed considerably faster, but can also be accomplished in the same amount of time, for the most part, independently of the magnitude of the next occurring deviation.

The above and other objects of the present invention are achieved by a method of adjusting a bimetal trip element in an electric switching device having at least one bimetal strip, securely fixed on one side, one tripping shaft to be pressurized by the unlatched end of the bimetal strip, and an adjusting screw, the method comprising the steps of (a) supplying an auxiliary force and pressurizing the tripping shaft with said auxiliary force at the location which interacts with the bimetal strip, until the part to be restrained by the tripping shaft is released, as well as measuring the path required for this and the force, and storing these variables in a processor, (b) the adjusting screw being screwed into place by a screw tool with a turning angle, which is controllable by the processor, until contact is made with the bimetal strip, and subsequently slackened back, in accordance with a computational value, which is calculated as a function of the measured values determined in step (a), (c) the bimetal strip being subjected to a current-dependent heating, and the time it takes from the start of the heating application until contact is made with the bimetal strips and tripping shaft being measured and stored in the processor, (d) in case of a continued heating of the bimetal strip, according to step (c), the tripping time being measured in the processor and stored, and (e) the setting of the adjusting screw being corrected with the screw tool by an amount calculated based on the determined measured values according to steps (c) and (d).

All that is required is that, first a specific number of tripping elements undergo the process steps providing a sufficient number of comparison values, from which the right correction value can be computed. Although the selected process steps can be quickly performed, they enable an extensive examination of the most important parameters. These are the parameters, which can change the tripping characteristics of a bimetal trip element, especially the resistance of the heating conductor to the bimetal, the characteristics of the bimetal itself, its fitting position and ambient temperature, as well as the release force and the tripping path.

In the case of multipole trip elements, it is recommended to implement the indicated process in a way such that the bimetal strips or their heating conductors are connected in series and the current-dependent heating is produced with a current corresponding to a multiple of the rated current, preferably 300%. This avoids overcompensating for the variations in the release force and the tripping path, which can occur in the case of a single-phase, experimental tripping and adjustment.

To implement the previously mentioned process steps (c) and (d), it is necessary to determine the time it takes for the bimetal strips to travel from the start of the heating application until contact is made with the corresponding adjusting screw. However, the subsequent combined movement of the bimetal strip and the tripping shaft must not be obstructed. Within the scope of the invention, a mechanism can be provided for this purpose, featuring a slide with springloaded connector pins, which can be fastened to the adjusting screws. After the closing of a signal circuit, configured by the bimetal strips, the adjusting screws and the connector pins, the slide bar can be propelled by a fast-acting driving arrangement. The mechanism thus permits the transit time and the subsequent tripping to be determined in one step without any restriction.

BRIEF DESCRIPTION OF THE DRAWINGS

The invention will be described in greater detail in the following detailed description with reference to the drawings, in which.

DETAILED DESCRIPTION

Figure 1:
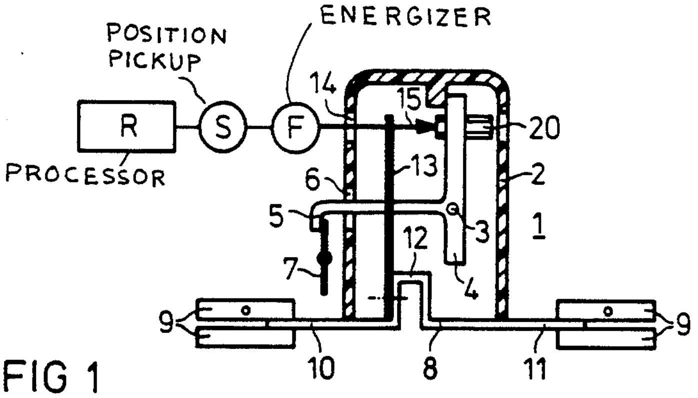
FIG. 1 illustrates a section through a schematically represented bimetal trip element during the measurement of the release force and the tripping path.

In the following description, one starts from the assumption that the bimetal trip element to be adjusted has its own housing produced as a separate unit, adjusted and then installed in a switching device, for example, a compact lowvoltage circuit-breaker with a housing of insulating material. Such a tripping unit can also contain an electromagnetic trip element. The invention, however, does not relate to this. FIG. 1 illustrates greatly simplified, a tripping unit 1, as described in the previously mentioned U.S. Pat. Nos. 3,815,064 or 3,244,837. An insulating housing 2 contains a tripping shaft 4 which swivels on a pivot bearing 3 and which has a latching arm 5. The latching arm juts through an opening 6 of the housing 2 and grasps there, in a hook-like manner, a part 7 to be latched, which is a component of the switching mechanism, not shown here, of a circuit-breaker. The mentioned patent documents contain details of the interaction between a tripping shaft and a switching mechanism, so a detailed description is not necessary.

In addition, the tripping unit 1 contains a part of the conducting path of the circuit breaker in the form of a conductor rail 8. The conductor rail has connecting points 10 or 11 on the opposite sides of the housing 2. At the same time, the connecting point 11, situated on the side of the housing 2, opposite the latching arm 5, forms the outer connecting point of the circuit-breaker. The opposite, this means the inner connecting point 10, is suitably connected, on the other hand, by means of a flexible connector, for example, by a movable contact lever. Both connecting points 10 and 11 serve as a retention system in an appropriate mechanism during the adjustment procedure. For this purpose, clamping jaws 9 are provided, through which a tripping current can be supplied, as well as drawn off.

The conductor rail 8 is bent in the form of an inverse U at location 12 inside the housing 2 and, at the same time, it forms a fixing point for a bimetal strip 13, as well as a heating conductor which indirectly heats the bimetal strip 13, as a function of current, and causes it to bend. Since the represented arrangement is designed for a multipole circuitbreaker, two or more bimetal strips are situated in the housing 2, each one of which is attached to a conductor rail and pressurizes the tripping shaft 4, as a function of the prevailing current flowing through the conductor.

To prepare for the adjustment of the tripping unit 1, the tripping unit is first placed in a position provided relative to a tripping mechanism, which is latched to the tripping shaft 4, as illustrated in FIG. 1. Then, a striker 15 is introduced through an opening 14 of the housing 2, so that it interacts at the same point with the tripping shaft 4, in the same way as does the bimetal strip 13. The striker 15 is connected to a position pickup S and an energizer F, and their method of operation is monitored by a processor R. Thereby, the processor measures the path that the auxiliary tool covers, starting from the position shown in FIG. 1 up to the position of the tripping shaft 4, where the part 7 to be latched is released by the latching arm 5. The force is also measured, which is required for this procedure.

Figure 2:
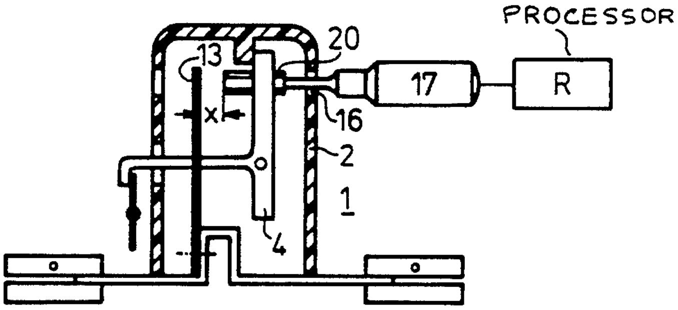
FIG. 2 is a representation according to FIG. 1, however, including an affixed screw tool for setting-up an adjusting screw.

Subsequently, according to the representation in FIG. 2, a screwdriver 17 is inserted through another opening 16 of the housing 2 to preset an adjusting screw 20, which is screwed into an opening of the tripping shaft 4, provided for this purpose. The method of operation of the screwdriver is subject to control by the processor R, as well, whereby, after contact is made with the bimetal strip 13, the adjusting screw 20 is slackened back by a specific measure. This is the measure which experience shows is required to effect the tripping action with a specific current load. The dimension X marked on FIG. 2 is based on the path and force required, as explained based on FIG. 1, to effect the tripping action, as well as the corresponding proper ties of the bimetal strip 13.

Figure 3:
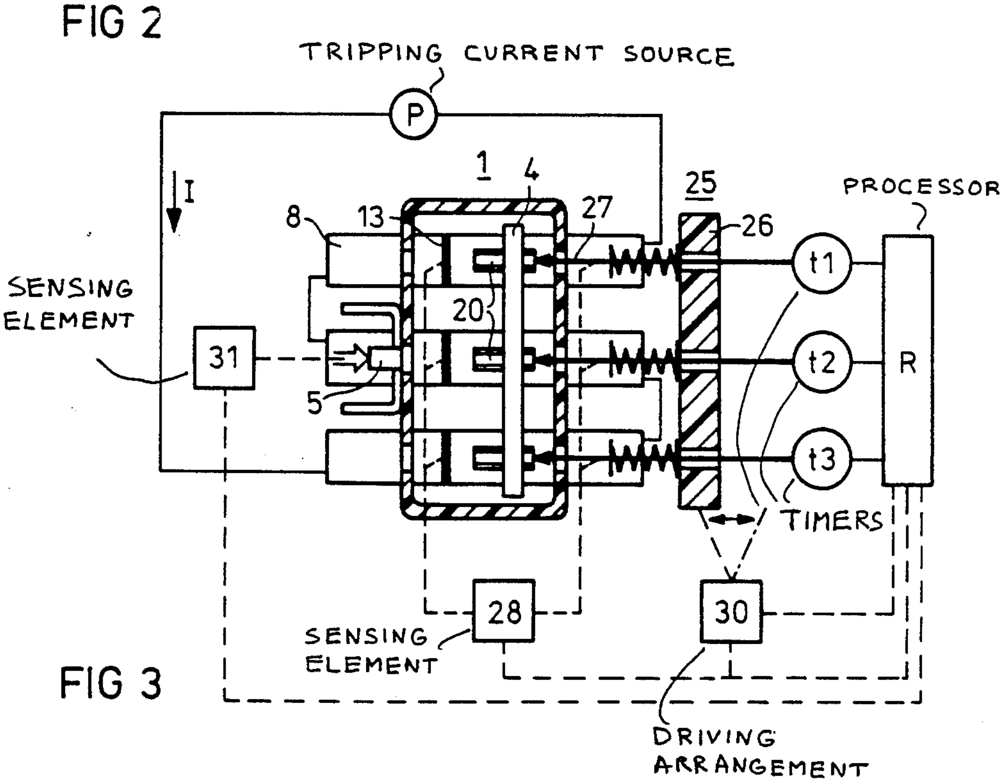
FIG. 3 depicts a section through a bimetal trip element with an arrangement to measure the time it takes for the bimetals to travel until contact is made with the assigned adjusting screw.

For the next step of the adjusting procedure, an auxiliary device is used, as depicted in a simplified version in FIG. 3. In this FIG., the tripping unit 1 is shown in a cut-away top view, so that the three bimetal strips 13, arranged side-by side, and the shared tripping shaft 4 with the adjusting screws 20 are visible. The mentioned auxiliary device 25 comprises, for the most part, a contact slide 26 with spring-loaded connector pins 27, as well as a driving arrangement 30. In the position shown in FIG. 3, the slide 26 is moved towards the tripping unit 1, by means of the driving arrangement 30, to the point where the connector pins 27 contact the adjusting screws 20. Now, if a current I is conducted through the series-connected conductor rails 8, by means of a tripping current source P, then the bimetal strips 13 are heated, and they bend, accordingly, in the direction of the adjusting screws 20. This procedure is preferably implemented with a current corresponding to 300% of the rated current. The timer is started at the same time that the tripping current I is switched on and, for each of the bimetal strips 13, now measures the time t1, t2 or t3 that goes by until the bimetal strip contacts the corresponding adjusting screw 20. It supplies these values to the processor R for storage. A sensing element 28 detects the contact action by means of auxiliary circuits, which include one of the bimetal strips, the corresponding adjusting screw and the connector pin 27 assigned to the adjusting screw. As soon as all the auxiliary circuits are closed, the sensing element 28 controls the driving arrangement 30 of the contact slide 26 and moves the contact slide away from the tripping unit !, so that now the tripping shaft 4—unhindered by the connector pins 27—is movable.

An additional sensing element 31, assigned to the latching point on the latching arm 5, measures the time that goes by, in the case of a continuously flowing tripping current I, until there is a tripping action. Based on the measured values, acquired in this manner, of the time it takes the bimetal strips 13 to travel until contact is made with the adjusting screws 20, and based on the total tripping time, the processor R computes a correction value to adjust the individual adjusting screws 20. This correction value can be converted into an angular turning of the adjusting screws 20 and serves then, in an arrangement according to FIG. 2, to control the screwdriver 17 by the processor R.

The described procedures represent a sequence of steps, some of which occur automatically and others of which are carried out by hand, and can be implemented in a time span of approximately three to four minutes. Only in a small percentage of tripping units, does one have to expect that an accurate adjustment will not be achieved. These tripping units must then be reworked since one can assume that they contain parts that lie outside of normal tolerance and therefore, cannot be adjusted in the usual manner.

In the foregoing specification, the invention has been described with reference to a specific exemplary embodiment thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. A method of adjusting a bimetal trip element in an electric switching device having at least one bimetal strip securely fixed on one side, a tripping shaft to be pressurized by the unlatched end of the bimetal strip and an adjusting screw, the method comprising the steps of:

(a) supplying an auxiliary force and pressurizing the tripping shaft with said auxiliary force at a location which interacts with the bimetal strip, until a part to be restrained by the tripping shaft is released, and measuring a path required for the release and the force, and storing variables related to the path and the force in a processor;

(b) screwing the adjusting screw into place with a screw tool means having a turning angle, said screw tool means being controllable by the processor until contact is made with the bimetal strip, and subsequently being slackened back in accordance with a computational value calculated as a function of the measured variables determined in step (a);

(c) heating the bimetal strip in a current-dependent heating, and measuring the time from the start of the heating until contact is made between the bimetal strip and adjusting screw and storing said time in the processor;

(d) measuring, in case of a continued heating of the bimetal strip, according to step (c), a tripping time in the processor and storing said tripping time; and (e) correcting the setting of the adjusting screw with the screw tool means by an amount calculated based on the determined measured values, according to steps (c) and (d).

2. The method recited in claim 1, wherein in the case of multipole trip elements, the bimetal strips or their heating conductors for said strips are connected in series and the current-dependent heating is produced with a current corresponding to a multiple of the rated current.

3. The method recited in claim 2, wherein the multiple is 300%.

4. An apparatus for adjusting a bimetal trip element in an electric switching device having at least one bimetal strip securely fixed on one side, a tripping shaft to be pressurized by the unlatched end of the bimetal strip and an adjusting screw, comprising:

(a) means for supplying an auxiliary force and for pressurizing the tripping shaft with said auxiliary force at a location which interacts with the bimetal strip, until a part to be restrained by the tripping shaft is released, and means for measuring a path required for the release and the force, and means for storing measured variables related to the path and the force in a processor;

(b) means for screwing the adjusting screw into place with a screw tool means having a turning angle, said screw tool means being controllable by the processor until contact is made with the bimetal strip, and subsequently being slackened back in accordance with a computational value calculated as a function of the measured variables;

(c) means for heating the bimetal strip in a current-dependent heating, and means for measuring the time from the start of the heating, until contact is made between the bimetal strip and adjusting screw and means for storing said time in the processor;

(d) means for measuring, in case of a continued heating of the bimetal strip, a tripping time in the processor and means for storing said tripping time; and (e) means for correcting the setting of the adjusting screw with the screw tool means by an amount calculated based on the determined measured values determined by said means for measuring of subparts (c) and (d).

5. The apparatus recited in claim 4, comprising three bimetal strips, wherein the tripping shaft is provided with adjusting screws and further comprising a slide having spring-loaded connector pins, which contact the adjusting screws, such that said bimetal strips, the corresponding adjusting screws and connector pins form auxiliary circuits wherein a sensing element senses when all of these circuits are closed and controls a driving arrangement that moves the said slide away from the tripping shaft.

* * * * *